US011132015B2

(12) United States Patent
Asaki et al.

(10) Patent No.: US 11,132,015 B2
(45) Date of Patent: Sep. 28, 2021

(54) POWERING CLOCK TREE CIRCUITRY USING INTERNAL VOLTAGES

(71) Applicant: MICRON TECHNOLOGY, INC., Boise, ID (US)

(72) Inventors: Kenji Asaki, Sagamihara (JP); Shuichi Tsukada, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 16/271,679

(22) Filed: Feb. 8, 2019

(65) Prior Publication Data

US 2020/0257331 A1    Aug. 13, 2020

(51) Int. Cl.
| | |
|---|---|
| *G06F 1/08* | (2006.01) |
| *H03B 5/12* | (2006.01) |
| *G06F 1/28* | (2006.01) |
| *G06F 1/06* | (2006.01) |
| *G06F 13/16* | (2006.01) |
| *G06F 13/00* | (2006.01) |
| *G06F 1/04* | (2006.01) |
| *G06F 1/10* | (2006.01) |

(52) U.S. Cl.
CPC ............... *G06F 1/08* (2013.01); *G06F 1/28* (2013.01); *H03B 5/1209* (2013.01); *G06F 1/04* (2013.01); *G06F 1/06* (2013.01); *G06F 1/10* (2013.01); *G06F 13/00* (2013.01); *G06F 13/1689* (2013.01)

(58) Field of Classification Search
CPC ..... G06F 1/04; G06F 1/10; G06F 1/06; G06F 13/1689; G06F 13/00; G06F 1/08; G06F 1/28; H03B 5/1209
USPC .................................. 713/400, 500, 600
See application file for complete search history.

(56) References Cited

U.S. PATENT DOCUMENTS

| | | | | |
|---|---|---|---|---|
| 2009/0295442 A1* | 12/2009 | Kwak | ................... | H03K 5/1508 |
| | | | | 327/158 |
| 2012/0133402 A1* | 5/2012 | Sato | ................... | H03K 3/356113 |
| | | | | 327/156 |
| 2012/0134439 A1* | 5/2012 | Sato | ...................... | G11C 29/025 |
| | | | | 375/295 |
| 2019/0056760 A1* | 2/2019 | Zhang | ............ | H03K 19/018528 |
| 2020/0160902 A1* | 5/2020 | Gans | .................... | G11C 29/028 |

* cited by examiner

*Primary Examiner* — Ji H Bae
(74) *Attorney, Agent, or Firm* — Dorsey & Whitney LLP

(57) ABSTRACT

In some embodiments, clock input buffer circuitry and divider circuitry use a combination of externally-suppled voltages and internally-generated voltages to provide the various clock signals used by a semiconductor device. For example, a clock input buffer is configured to provide second complementary clock signals responsive to received first complementary clock signals using cross-coupled buffer circuitry coupled to a supply voltage and to drive the first complementary clock signals using driver circuitry coupled to an internal voltage. In another example, a divider circuitry may provide divided clock signals based on the second complementary clock signals via a divider coupled to the internal voltage and to drive the divided clock signals using driver circuitry coupled to the supply voltage. A magnitude of the supply voltage may be less than a magnitude of the internal voltage.

16 Claims, 4 Drawing Sheets

POWERING CLOCK TREE CIRCUITRY USING INTERNAL VOLTAGES

BACKGROUND OF THE INVENTION

High data reliability, high speed of memory access, low power, and reduced chip size are features that are demanded from semiconductor memory. Within a memory, it is often desirable for circuitry to directly use external supply voltages. However, because external supply voltages are often tied to many other devices within a system, they may have jitter or may fluctuate. Voltage fluctuations may affect some applications that are sensitive to noise, such as clock signal generators. As clock speeds increase, clock signal generators may become more sensitive to timing issues caused by a noisy power supply, which may affect reliability and robustness of the memory device.

DETAILED DESCRIPTION

Figure 1:
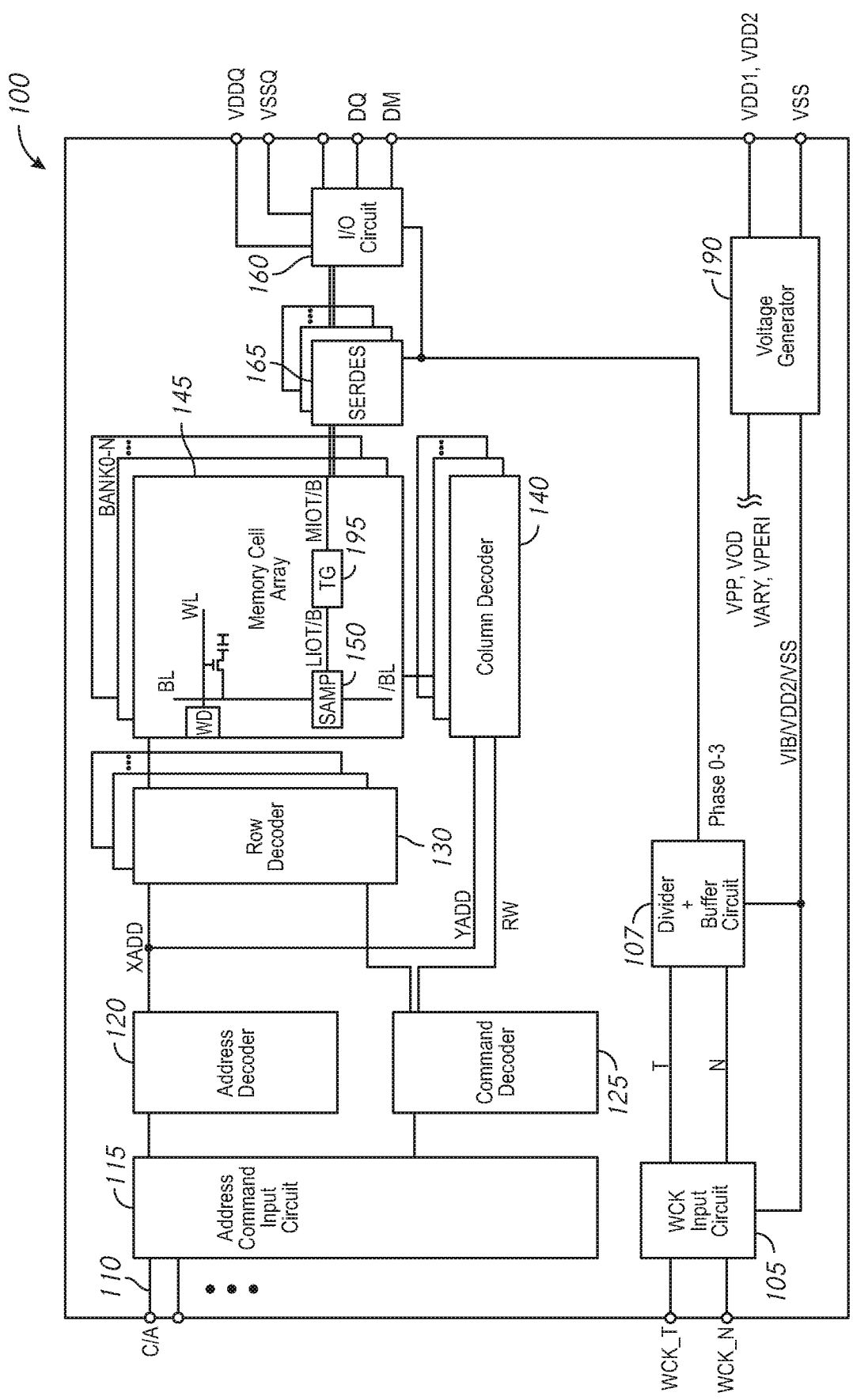
FIG. 1 is a schematic block diagram of a semiconductor device, in accordance with an embodiment of the present disclosure.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes devices and techniques for using different voltages within clock buffers to provide clock signals for use in a semiconductor device, such as for read and write operations in a memory device. For example, many memory devices, such as double data rate (DDR) DRAM devices, including DDR4, DDR5, low power DDR5 (LPDDR5), graphics DDR (GDDR) DRAM devices, include circuitry to perform read and write operations. Many different clock signals can be employed to allow the memory device to provide high performance reading and writing from and into the memory.

Clock signals may be provided to control the read and write circuitry such that data is provided and received according to specified timing. In high speed applications, small deviations in clock signal timing may affect reliability of the memory. Fluctuations in voltages powering the clock buffers may affect this timing. Thus, internally-generated voltages may be desirable to mitigate voltage fluctuations on externally-supplied voltages, but this increases current draw on supply voltages used to generate the internal voltages.

Therefore, this disclosure describes examples of clock input buffer circuitry and divider circuitry that use a combination of externally-suppled voltages and internally-generated voltages to provide the various clock signals used by the semiconductor device.

For example, a clock input buffer may be configured to receive first complementary clock signals and may include a first and second stage each coupled to a first and second supply voltages. Responsive to the first complementary clock signals, the first and second stage may provide second complementary clock signals based on the first and second supply voltages. The clock input buffer may further include a pair of driver circuits coupled to an internal voltage and the second supply voltage and configured to receive the second complementary clock signals. In response to the second complementary clock signals, the pair of driver circuits may provide third complementary clock signals in response to the second complementary clock signals and based on the internal voltage and the second supply voltage.

Further, a divider circuit may be coupled to the internal voltage and the second supply voltage and configured to provide a divided clock signal (e.g., or a plurality of divided clock signals) in response to the third complementary clock signals and based on the internal voltage and the second supply voltage. The divider circuit may include an output buffer coupled to the first and second supply voltages and configured to provide a second divided clock signal in response to the divided clock signal based on the first and second supply voltages. Use of the internal voltage to generate the divided clock signals may mitigate jitter caused by voltage fluctuations in the first supply voltage, while use of the first supply voltage to drive the divided clock signal may limited power consumption to generate the internal voltage.

FIG. 1 is a schematic block diagram of a semiconductor device 100, in accordance with an embodiment of the present disclosure. The semiconductor device 100 may include a WCK input circuit 105, a divider and buffer circuit 107, an address/command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a serializer/deserializer (SERDES) circuitry 165, an input/output (I/O) circuit 160, and a voltage generator circuit 190. The semiconductor device 100 may include a plurality of external terminals including address and command terminals coupled to command/address bus 110, clock terminals CK and/CK, data terminals DQ, DQS, and DM, and power supply terminals VDD1, VDD2, VSS, VDDQ, and VSSQ. The semiconductor device may be mounted on a substrate, for example, a memory module substrate, a mother board or the like.

The memory cell array 145 includes a plurality of banks 0-N, with each bank 0-N including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 152 are provided for their corresponding bit lines BL and coupled to at least one respective local I/O line further coupled to a respective one of at least two main I/O line pairs, via transfer gates TG 195, which function as switches. In some examples, the sense amplifiers 150 may include threshold voltage compensation circuitry configured to compensate for threshold voltage differences between components of the sense amplifier.

Threshold voltage differences may exist due to process, voltage, and temperature (PVT) variance among various components.

The address/command input circuit 115 may receive an address signal and a bank address signal from outside (e.g., via a memory controller) at the command/address terminals via the command/address bus 110 and may transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may also receive command signals and chip select signals from outside (e.g., from the memory controller) at the command/address terminals via the command/address bus 110 and may provide the command signals and the chip select signals to the command decoder 125. The command signals may include various memory commands, such as access (e.g., read/write) commands. The chip select signals select the semiconductor device 100 to respond to commands and addresses provided to the command and address terminals. That is, in response to receipt of an active chip select signal at the semiconductor device 100, commands and addresses at the command/address terminals via the command/address bus 110 may be decoded to perform memory operations. The command decoder 125 may decode the command signals to generate various internal command signals. For example, the internal command signals may include a row command signal to select a word line, a column command signal, such as a read command or a write command, to select a bit line. The internal command signals can also include output and input activation commands, such as clocked command.

Accordingly, when a read command is issued and a row address and a column address are timely supplied with the read command, read data is read from a memory cell in the memory cell array 145 designated by the row address and the column address. The read command may be received by the command decoder 125. Read/write amplifiers of the SERDES circuitry 165 may receive the read data DQ and provide the read data DQ to the I/O circuit 160. The I/O circuit 160 may provide the read data DQ to outside via the data terminals DQ, together with a data mask signal at the data mask terminal DM. The read data may be provided at a time defined by read latency RL information that can be programmed in the semiconductor device 100, for example, in a mode register (not shown in FIG. 1). The read latency RL information RL may be defined in terms of clock cycles of the CK clock signal. For example, the read latency RL information may be defined as a number of clock cycles of the CK signal after the read command is received at the semiconductor device 100 when the associated read data is provided at an output via the data terminals DQ and DM.

Similarly, when the write command is issued and a row address and a column address are timely supplied with the write command, and then the I/O circuit 160 may receive write data at the data terminals DQ, together with a data mask DM signal and provide the write data via the read/write amplifiers of the SERDES circuitry 165. The SERDES circuitry 165 may provide the write data to the memory cell array 145. The write command may be received by the command decoder 125. Thus, the write data may be written in the memory cell designated by the row address and the column address. The write data and the data mask signal may be provided to the data terminals DQ and DM, respectively, at a time that is defined by write latency WL information. The write latency WL information may be programmed in the semiconductor device 100, for example, in the mode register (not shown in FIG. 1). The write latency WL information may be defined in terms of clock cycles of a clock signal CK. For example, the write latency WL information may be a number of clock cycles of the CK signal after receipt of the write command at the semiconductor device 100 when the associated write data and data mask signal are received at the data terminals DQ and DM.

Turning to the explanation of the external terminals included in the semiconductor device 100, the power supply terminals may receive power supply voltages VDD1, VDD2, and VSS. These power supply voltages VDD1, VDD2, and VSS may be supplied to a voltage generator circuit 190. The voltage generator circuit 190 may generate various internal voltages, VPP, VOD, VARY, VPERI, VIB, and the like based on the power supply voltages VDD1, VDD2, and VSS. Specifically, the internal voltage VIB may be generated using the VDD1 voltage. The internal voltage VIB may have a greater magnitude than the supply voltage VDD2. The internal voltage VPP is mainly used in the row decoder 130 and column decoder 140, the internal voltages VOD and VARY are mainly used in the sense amplifiers 150 included in the memory cell array 145, the internal voltage VIB (along with the power supply voltages VDD2 and VSS) is used in the WCK input circuit 105 and the divider and buffer circuit 107, and the internal voltage VPERI is used in many other circuit blocks. The I/O circuit 160 may receive the power supply voltages VDDQ and VSSQ. For example, the power supply voltages VDDQ and VSSQ may be the same voltages as the power supply voltages VDD1 and VSS, respectively. However, the dedicated power supply voltages VDDQ and VSSQ may be used for the I/O circuit 160.

The clock terminals WCK_T and WCK_N may receive an external clock signal WCK_T and a complementary external clock signal WCK_N, respectively. The WCK_T and WCK_N clock signals may be write clock signals, in some examples. The WCK_T and WCK_N clock signals may be supplied to a WCK input circuit 105. The WCK input circuit 105 may generate complementary internal clock signals T and N based on the WCK_T and WCK_N clock signals. The WCK input circuit 105 may provide the T and N clock signals to the divider and buffer circuit 107. The divider and buffer circuit 107 may generate phase and frequency controlled internal clock signals PHASE0-3 based on the T and N clock signals T and N and a clock enable signal CKE (not shown in FIG. 1). The PHASE 0-3 clock signals may be phase shifted relative to one another by 90 degrees. For example, the PHASE 0 clock signal is phased-shifted 0 degrees relative to the internal clock signal T, the PHASE 1 clock signal is phased-shifted 90 degrees relative to the internal clock signal T, the PHASE 2 clock signal is phased-shifted 180 degrees relative to the internal clock signal T, and the PHASE 3 clock signal is phased-shifted 270 degrees relative to the internal clock signal T.

The divider and buffer circuit 107 may provide the PHASE 0-3 clock signals to the SERDES circuitry 165 and to the I/O circuit 160. The SERDES circuitry 165 may support high speed read and write operations by deserializing high speed write data and serializing high speed read data. For example, during a high speed write operation, the I/O circuit 160 may receive and buffer (e.g., via input buffers) serialized write data in response to the PHASE 0-3 clock signals. The SERDES circuitry 165 may be configured to retrieve the serialized write data from the input buffers of the I/O circuit 160 responsive to the PHASE 0-3 clock signals, and deserialize the serialized write data (e.g., make it parallel) to provide deserialized write data. The SERDES circuitry 165 may provide the deserialized write data to memory cell array 145. Thus, during a high speed write operation, data is received at I/O circuit 160 via the data terminals DQ and is deserialized using the SERDES circuitry 165 using the PHASE 0-3 clock signals.

Because the PHASE 0-3 clock signals are used in high speed read operations, accuracy and precision of relative timing of the PHASE 0-3 clock signals may be important to ensure read data is provided to the data terminals DQ and DM at an expected time according to the read latency RL information. Thus, to generate the internal clock signals T and N and the PHASE 0-3 clock signals, some circuitry of the WCK input circuit 105 and the divider and buffer circuit 107, respectively, may be coupled to (e.g., powered by) the power supply VDD2 and other circuitry of the WCK input circuit 105 and the divider and buffer circuit 107 may be coupled to the internal voltage VIB. Because the supply voltage VDD2 is an external voltage and may be provided to other semiconductor devices, the supply voltage VDD2 may fluctuate (e.g., become noisy) as power consumption by those other connected semiconductor devices changes over time. Noise on the supply voltage VDD2 may affect timing (e.g., transition timing) of circuitry of the WCK input circuit 105 and the divider and buffer circuit 107. Because the internal voltage VIB is internally generated in the voltage generator circuit 190, it may be more stable (e.g., less susceptible to noise or fluctuations) than the supply voltage VDD2. Therefore, to protect against the noise in the supply voltage VDD2, the internal voltage VIB may be used to power circuitry of the WCK input circuit 105 and the divider and buffer circuit 107. However, increased use of the internal voltage VIB by the WCK input circuit 105 and the divider and buffer circuit 107 may increase current drawn on the supply voltage VDD1 by the voltage generator circuit 190 to generate the internal voltage VIB. In some implementations, the semiconductor device 100 limited to a specific current draw on the supply voltage VDD1. To mitigate an increase in the current drawn to generate the internal voltage VIB, use of the internal voltage VIB to power the WCK input circuit 105 and the divider and buffer circuit 107 may be used by a subset of the circuitry of the WCK input circuit 105 and the divider and buffer circuit 107 that is timing critical, and other circuitry of the WCK input circuit 105 and the divider and buffer circuit 107 may be coupled to the supply voltage VDD2.

Additionally, during a high speed read operation, deserialized read data may be received from the memory cell array 145, and the SERDES circuitry 165 may be configured to serialize the deserialized read data responsive to a read clock signal (not shown) to provide serialized read data. The SERDES circuitry 165 may provide the serialized read data to the I/O circuit 160 responsive to the read clock signal. The read clock signals may be used by transceivers of the SERDES circuitry 165 to support the high speed read operations to serialize the deserialized read data received from the memory cell array 145. That is, the SERDES circuitry 165 may serialize the deserialized read data based on timing of the read clock signals provide the serialized read data.

Figure 2:
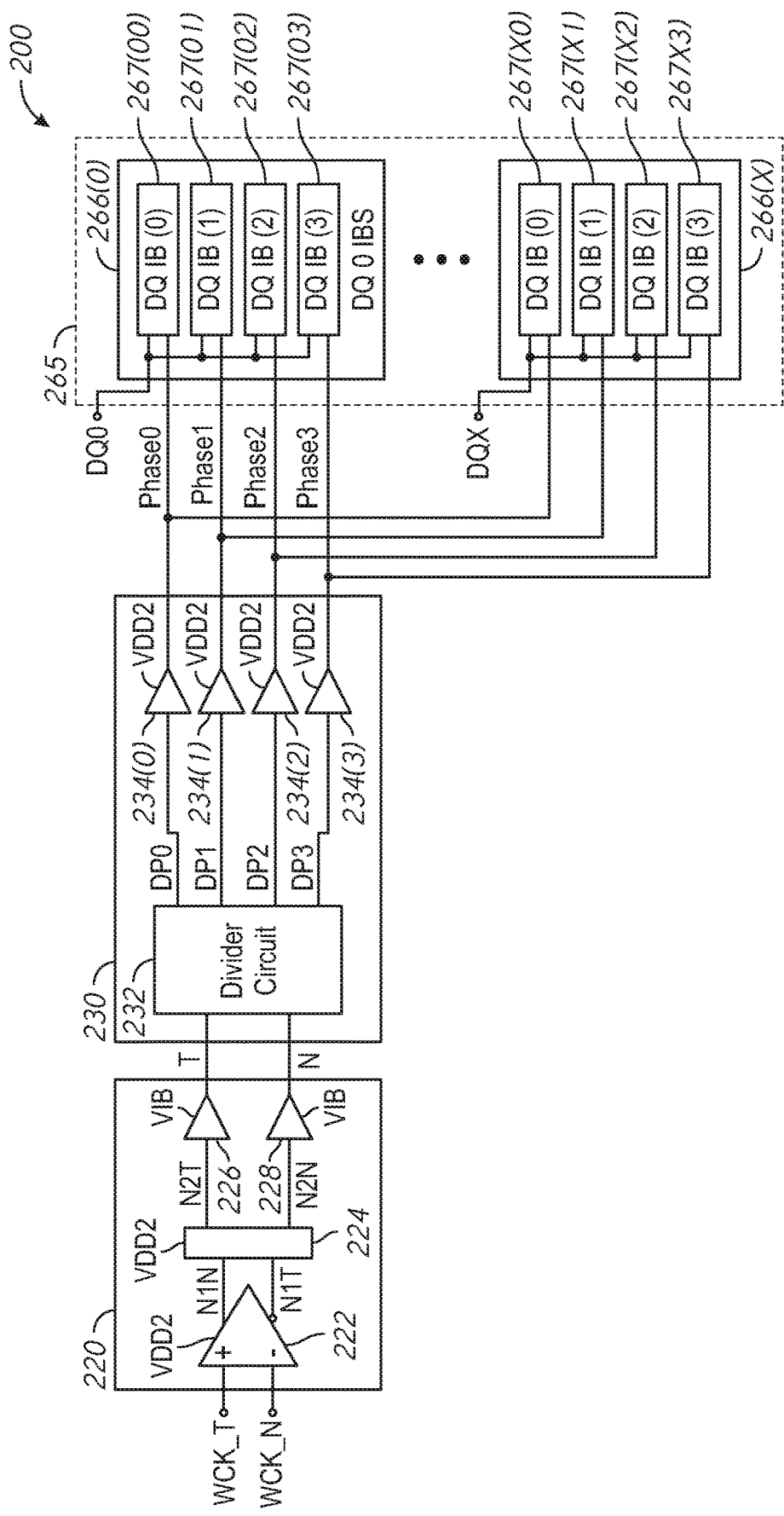
FIG. 2 is a block diagram of part of a semiconductor device in accordance with an embodiment of the disclosure.

FIG. 2 is a block diagram of part of a semiconductor device 200 in accordance with an embodiment of the disclosure. The semiconductor device 200 may include a WCK input circuit 220, a divider and buffer circuit 230, and an I/O circuit 265. The semiconductor device 100 of FIG. 1 may implement the semiconductor device 200, in some examples. For example, the 105 of FIG. 1 may implement the WCK input circuit 220, the divider and buffer circuit 107 of FIG. 1 may implement the divider and buffer circuit 230, the I/O circuit 160 of FIG. 1 may implement the I/O circuit 265, or any combination thereof. The WCK input circuit 220 and the divider and buffer circuit 230 may be configured to generate frequency and phase shifted clock signals PHASE 0-3 based on received complementary (e.g., phase-shifted 180 relative to one another) clock signals WCK_T and WCK_N. The WCK_T and WCK_N clock signals may be write clock signals, in some examples. The 275 may be configured to latch data in data input buffers responsive to the PHASE 0-3 clock signals, such as during a write operation.

The WCK input circuit 220 may include a first stage 222, a second stage 224, a driver 226, and a driver 228. The first stage 222 may receive the WCK_T and WCK_N clock signals and may provide complementary N1N and N1T clock signals. The second stage 224 may receive the N1N and N1T clock signals and may provide the complementary N2T and N2N clock signals. The second stage 224 may be cross-coupled such that the N2T and the N2N also have complementary duty cycles. The driver 226 and the driver 228 may provide internal clock signals T and N, respectively, responsive to the N2T and N2N clock signals, respectively. The T and N clock signals may be complementary. Within the WCK input circuit 220, circuitry of the first stage 222 and the second stage 224 may be coupled to (e.g., powered by) a supply voltage VDD2 (e.g., a first voltage or first supply voltage). Circuitry of the driver 226 and the driver 228 may be coupled to an internal voltage VIB (e.g., a second voltage or second supply voltage). The internal voltage VIB may be generated from a supply voltage VDD1. The internal voltage VIB may have a greater magnitude than the supply voltage VDD2. For example, the internal voltage VIB may have a magnitude of 1.2 volts, and the supply voltage VDD2 may have a magnitude between 0.96 volts and 1.12 volts. The supply voltage VDD1 may have a magnitude of 1.6 volts.

The divider and buffer circuit 230 may include a divider circuit 232 and drivers 234(0)-(3). The divider circuit 232 may receive the T and N clock signals and may divide the T and N clock signals to provide frequency and phase adjusted divided phase clock signals DP0-3. The DP 0-3 clock signals may have a frequency that is half of a frequency of the T and N clock signals, and may be phase shifted relative to one another by 90 degrees. For example, the DP0 clock signal may be phased-shifted 0 degrees relative to the T clock signal T, the DP1 clock signal may be phased-shifted 90 degrees relative to the T clock signal, the DP2 clock signal may be phased-shifted 180 degrees relative to the T clock signal, and the DP3 clock signal may be phased-shifted 270 degrees relative to the T clock signal. Each of the drivers 234(0)-(3) may drive a respective one of the DP0-3 clock signals at an output as the PHASE 0-3 clock signals. Similar to the DP0-3 clock signals, the PHASE 0-3 clock signals may be phase shifted relative to one another by 90 degrees. For example, the PHASE 0 clock signal may be phased-shifted 0 degrees relative to the T clock signal T, the PHASE 1 clock signal may be phased-shifted 90 degrees relative to the T clock signal, the PHASE 2 clock signal may be phased-shifted 180 degrees relative to the T clock signal, and the PHASE 3 clock signal may be phased-shifted 270 degrees relative to the T clock signal. Within the divider and buffer circuit 230, circuitry of the divider circuit 232 may be coupled to the internal voltage VIB, and circuitry of each of the drivers 234(0)-(3) may be coupled to the supply voltage VDD2 due to a current limitation derived from the supply voltage VDD1.

The I/O circuit 265 may include data (e.g., write data) input buffer circuits 266(0)-(X) that each correspond to a respective data terminal DQ0-DQX (e.g., or a data mask terminal DM). Each of the data input buffer circuits 266(0)- (N) may include a respective four data input buffers 267 (00)-(03) to data input buffers 267(X0)-(X3). Each of the data input buffers 267(00)-(03) to data input buffers 267 (X0)-(X3) may both latch/store write data (e.g., received from an external device/comptroller) and provide the latched/stored write data responsive to a respective one of the PHASE 0-3 clock signals. For example, each of the data input buffer 267(00), the data input buffer 267(10), . . . , and the data input buffer 267(X0) may latch/store write data received on the respective data terminal DQ0-DQX and provide the latched/stored write data to a memory array (e.g., the memory cell array 145 of FIG. 1) responsive to the PHASE 0 clock signal. Each of the data input buffer 267(01), the data input buffer 267(11), . . . , and the data input buffer 267(X1) may latch/store write data received on the respective data terminal DQ0-DQX and provide the latched/stored write data to the memory array responsive to the PHASE 1 clock signal. Each of the data input buffer 267(02), the data input buffer 267(12), . . . , and the data input buffer 267(X2) may latch/store write data received on the respective data terminal DQ0-DQX and provide the latched/stored write data to the memory array responsive to the PHASE 2 clock signal. Each of the data input buffer 267(03), the data input buffer 267(13), . . . , and the data input buffer 267(X3) may latch/store write data received on the respective data terminal DQ0-DQX and provide the latched/stored write data to the memory array responsive to the PHASE 3 clock signal. In some examples the latched/ stored write data may be provided to the memory array via a serializer/deserializer circuit, such as the serializer/deserializer circuit 165 of FIG. 1.

In operation, the WCK input circuit 220 may receive the WCK_T and WCK_N clock signals and may provide the T and N clock signals based on the WCK_T and WCK_N clock signals. Some circuitry of the WCK input circuit 220 may be coupled to the supply voltage VDD2 (e.g., the first stage 222 and the second stage 224), while other circuitry of the WCK input circuit 220 may be coupled to the internal voltage VIB (e.g., the driver 226 and the driver 228). The first stage 222 and the second stage 224 are configured to provide the N2T and the N2N clock signals having complementary phases and duty cycles based on the WCK_T and WCK_N clock signals. The first stage 222 is a first stage of the WCK input circuit 220 that is configured to provide the N1N and N1T clock signals to drive circuitry of the second stage 224. The N1N and the N1T clock signals are based on the WCK_T and WCK_N clock signals. The second stage 224 is a second stage of the WCK input circuit 220 that is configured to provide the N2T and the N2N clock signals using cross-coupled circuitry to provide complementary phases and duty cycles on the N2T and N2N signals. The logic high and logic low values of the N1T, TIN, N2N, and N2T clock signals may be based on the supply voltages VDD2 and VSS, respectively.

The driver 226 may be configured to drive the T clock signal based on the N2T clock signal and the driver 228 may be configured to drive the N clock signal based on the N2N clock signal. The T and N clock signals may be used by the divider and buffer circuit 230 to provide the PHASE 0-3 clock signals. Because the PHASE 0-3 clock signals are used in high speed write operations, accuracy and precision of relative timing of the PHASE 0-3 clock signals may be important to ensure write data is captured at the data input buffer. When the multiple frequency-adjusted and phase-shifted DP0-3 clock signals are derived from the T and N clock signals, maintaining relative transition timing over time is important to ensuring this accuracy is maintained. Thus, the driver 226 and the driver 228 may generate the T and N clock signals, and the divider circuit 232 may generate the DP0-3 clock signals using the internal voltage VIB, which may be more stable and less noisy than the supply voltage VDD2. The logic high and logic low values of the T and N clock signals and the DP0-3 clock signals may be based on the internal voltage VIB and the supply voltage VSS, respectively.

The divider circuit 232 may provide the DP0-3 clock signals having half of the frequency of the T and N clock signals, and may be phase-shifted by 90 degrees relative to one another. Each of the drivers 234(0)-(3) receive a respective one of the DP0-3 clock signals, and may drive the respective one of the DP0-3 clock signals at an output as a respective one of the PHASE 0-3 clock signals. The logic high and logic low values of the PHASE 0-3 clock signals may be based on the supply voltages VDD2 and VSS, respectively.

The I/O circuit 265 may latch/store respective write data received on the data terminals DQ0-DQX at the data input buffer circuits 266(0)-(X) and may provide the latched/ stored write data to the memory array. In some examples, one of the data input buffer circuits 266(0)-(X) may correspond to a data mask DM signal. Each of the data input buffers 267(00)-(03) to data input buffers 267(X0)-(X3) within the data input buffer circuits 266(0)-(X), respectively, may latch/store and provide write data received on the respective data terminal DQ0-DQX responsive to a respective one of the PHASE 0-3 clock signals. The data input buffers 267(00)-(03) of each of the data input buffer circuits 266(0)-(X) may be accessed by a serializer/deserializer to deserialize the latched/stored write data responsive to the PHASE 0-3 clock signals. It is appreciated that one or more of the first stage 222, the second stage 224, and/or the drivers 234(0)-(3) may be coupled to the internal voltage VIB, in some examples, without departing from the scope of the disclosure. In addition, the PHASE 0-3 clock signals may be applied to read data provided in parallel (e.g., deserialized) from the memory cell array. For example, the deserialized read data may be deserialized (e.g., via the serializer/ deserializer) by latching/storing parts of the deserialized read data at individual output buffers of the I/O circuit 265 responsive to the PHASE 0-3 clock signals, and the I/O circuit 265 may provide the serialized read data to the respective data terminal DQ0-DQX responsive to the PHASE 0-3 clock signals.

Figure 3:
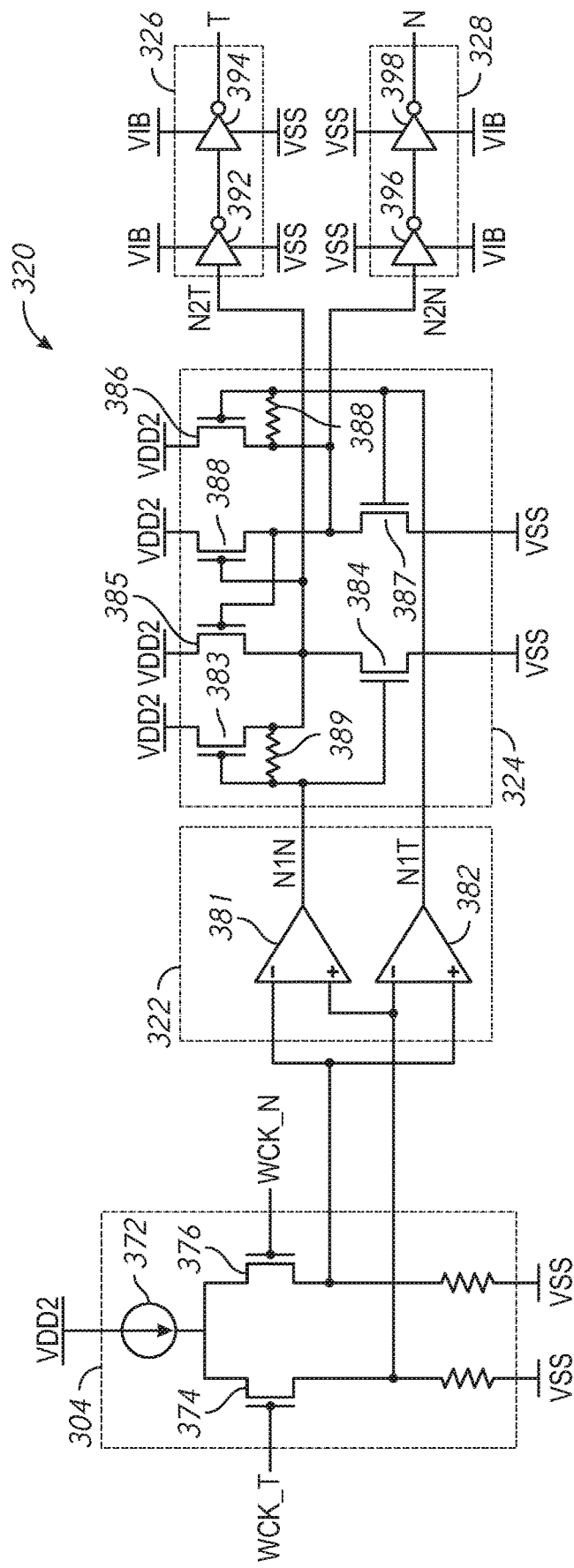
FIG. 3 is a block diagram of part of a WCK input circuit in accordance with an embodiment of the disclosure.

FIG. 3 is a block diagram of part of a WCK input circuit 320 in accordance with an embodiment of the disclosure. The WCK input circuit 320 may include a current-mode logic (CML) buffer 304, a first stage (e.g., differential amplifier circuit) 322, a second stage (e.g., cross-coupled buffer circuit with de-emphasis resistors 388 and 389) 324, a driver 326, and a driver 328. The WCK input circuit 105 of FIG. 1 and/or the WCK input circuit 220 of FIG. 2 may implement the WCK input circuit 320, in some examples. The WCK input circuit 320 may be configured to generate complementary (e.g., phase-shifted 180 relative to one another) clock signals T and N based on received complementary clock signals WCK_T and WCK_N.

The CML buffer 304 may be configured to circuitry of the first stage 322. The CML buffer 304 may be provided to support the WCK_T and WCK_N clock signals operating at a high frequency, with a current source 372 of the CML buffer 304 controlling power consumption by providing a constant current output. The CML buffer 304 may include a p-type transistor 374 controlled by the WCK_T signal to provide a first signal to the first stage 322 and a p-type transistor 376 controlled by the WCK_N clock signal to provide a second signal to the first stage 322. The first signal may be provided from a node between the p-type transistor 374 and a resistance that coupled to the supply voltage VSS, and the second signal may be provided from a node between the p-type transistor 376 and a resistance that coupled to the supply voltage VSS. The first signal may be complementary to the WCK_T signal and the second signal may be complementary to the WCK_N signal. The current source 372 may be coupled to a supply voltage VDD2.

The first stage 322 may provide complementary clock signals N1N and N1T based on the first and second signals received from the CML buffer 304. The first stage 322 may include a differential amplifier 381 configured to provide the N1N clock signal and a differential amplifier 382 configured to provide the N1T clock signal. The first signal is provided to a positive input of the differential amplifier 381 and a negative input of the differential amplifier 382, and the second signal is provided to a negative input of the differential amplifier 381 and a positive input of the differential amplifier 382. Accordingly, based on this inverted coupling of the first and second signals, the N1N and N1T clock signals may be complementary. The differential amplifier 381 and the differential amplifier 382 may be coupled to the supply voltages VDD2 and VSS.

The second stage 324 may receive the N1N and N1T clock signals and may provide the complementary N2T and N2N clock signals. The second stage 324 may include a first inverter (e.g., a p-type transistor 383 and an n-type transistor 384 coupled in series) configured to provide the N2T clock signal responsive to the N1N clock signal. The second stage 324 may further include a second inverter (e.g., a p-type transistor 386 and an n-type transistor 387 coupled in series) configured to provide the N2N clock signal responsive to the N1T clock signal. To ensure duty cycles of the N2T and N2N clock signals are complementary, the second stage 324 may further include a p-type transistor 385 coupled to the N2T clock signal and controlled by the N2N clock signal, and a p-type transistor 388 coupled to the N2N clock signal and controlled by the N2T clock signal. Effectively, the p-type transistor 385 and the p-type transistor 388 may cross-couple the N2T and N2N clock signals to provide a complementary duty cycle relationship. The p-type transistor 383, the p-type transistor 385, the p-type transistor 386, and the p-type transistor 388 may be coupled to the supply voltage VDD2. The n-type transistor 384 and the n-type transistor 387 may be coupled to the supply voltage VSS. Additionally, the second stage 324 may include a resistor 389 to make the N1N and N2T short-circuited and another resistor 388 to make the N1T and N2N short-circuited. Each of the resistors 388 and 389 is provided to perform a de-emphasis operation on the respective N2N and N2T clock signals. The de-emphasis operation prevents the N2N and N2T clock signals from a full voltage swing between the supply voltages VDD2 and VSS, which may make it easier to transfer the N2N and N2T clock signals to the next state.

The driver 326 and the driver 328 may provide complementary internal clock signals T and N responsive to the N2T and N2N clock signals, respectively, received from the second stage 324. The driver 326 may include serially-coupled inverters 392 and 394, and the driver 328 may include serially-coupled inverters 396 and 398. It is appreciated that each of the driver 326 and the driver 328 may include more than two serially-coupled inverters without departing from the scope of the disclosure, although the driver 326 and the driver 328 may be implemented with an equal number of serially-coupled inverters to maintain a complementary timing relationship between the T and N signals. The serially-coupled inverters 392 and 394 of the driver 326 and the serially-coupled inverters 396 and 398 may be coupled to an internal voltage VIB and the supply voltage VSS. Here, N2T and N2N clock signals are controlled to be fully amplified between the internal voltage VIB and the supply voltage VSS.

In operation, the WCK input circuit 320 may receive the WCK_T and WCK_N clock signals and may provide the T and N clock signals based on the WCK_T and WCK_N clock signals. The CML buffer 304, the first stage 322, and the second stage 324 may be coupled to the supply voltages VDD2 and VSS, while the driver 326 and the driver 328 are coupled to the internal voltage VIB and the supply voltage VSS. The logic high and logic low voltages of the WCK_T and WCK_N clock signals may be based on a specified voltages VIH and VIL, respectively, which have a voltage differential that is less than a voltage differential between the supply voltages VDD2 and VSS. Responsive to the WCK_T and WCK_N clock signals, the p-type transistor 374 and the p-type transistor 376 (e.g., and the current source 372) may provide the first and second signals, respectively. Responsive to the first and second signals provided by the CML buffer 304, the differential amplifier 381 and the differential amplifier 382 of the first stage 322 may be configured to provide the N1N and the N1T clock signals, respectively, using differential logic. Coupling of the first and second signals to inputs of the differential amplifier 381 and the differential amplifier 382 may be inverted such that the N1N and the N1T signals are complementary. The logic high and logic low voltages of the N1N and N1T clock signals may be based on the supply voltages VDD2 and VSS, respectively. However, because of the high speed operation and circuit loss, the magnitudes of the logic high and logic low voltages (e.g., VH1 and VL1, respectively) of the N1N and N1T clock signals may have a voltage differential that is greater than the VIH and VIL voltages and less than a voltage differential between the supply voltages VDD2 and VSS.

The first inverter (e.g., the p-type transistor 383 and the n-type transistor 384 coupled in series) of the second stage 324 is configured to provide the N2T clock signal responsive to the N1N clock signal, and the second inverter (e.g., the p-type transistor 386 and the n-type transistor 387 coupled in series) is configured to provide the N2N clock signal responsive to the N1T clock signal. The N2T and N2N clock signals are also cross-coupled via the p-type transistor 386 and the p-type transistor 388 to provide complementary duty cycles on the N2T and N2N clock signals. The logic high and logic low voltages of the N2T and N2N clock signals may be based on the supply voltages VDD2 and VSS, respectively, but as explained above with respect to the de-emphasis operation, the magnitudes of the logic high and logic low voltages (e.g., V2H and V2L, respectively) of the N2T and N2N clock signals may have a voltage differential that is greater than the VH1 and VL1 voltages and less than a voltage differential between the supply voltages VDD2 and VSS.

The driver 326 (e.g., via the serially-coupled inverters 392 and 394) and the driver 328 (e.g., via the serially-coupled inverters 396 and 398) may provide The T and N clock signals responsive to the N2T and N2N clock signals, respectively. The logic high and logic low values of the T and N clock signals may be based on the internal voltage VIB and the supply voltage VSS, respectively. Because the T and N clock signals may be used to provide frequency-divided and phase-shifted clock signals (e.g. the PHASE 0-3 clock signals of FIG. 1 and/or the PHASE 0-3 clock signals of FIG. 2) to be used in high speed write operations, accuracy and precision of relative timing of the T and N clock signals may be important for generation of these frequency-divided and phase-shifted clock signals. Thus, the driver 326 and the driver 328 may generate the T and N clock signals using the internal voltage VIB, which may be more stable and less noisy than the supply voltage VDD2. It is appreciated that one or more of the first stage 322 and/or the second stage 324 may be coupled to the internal voltage VIB, in some examples, without departing from the scope of the disclosure.

Figure 4:
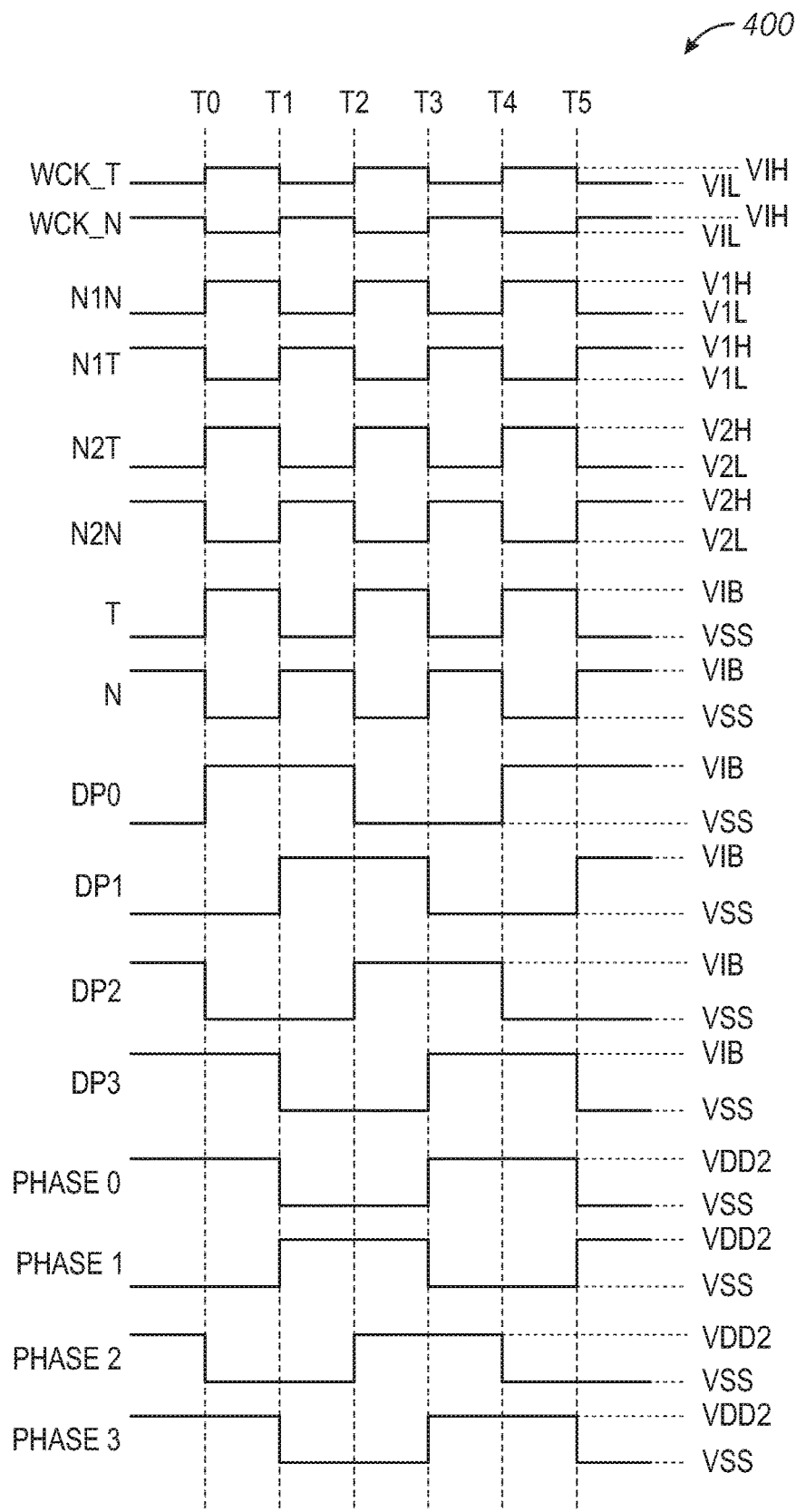
FIG. 4 is an illustration of an exemplary timing diagram depicting operation of clock signal generators in accordance with embodiments of the disclosure.

FIG. 4 is an illustration of an exemplary timing diagram 400 depicting operation of clock signal generators in accordance with embodiments of the disclosure. In some examples, the timing diagram 400 may depict operation of the semiconductor device 100 (e.g., the WCK input circuit 105, the divider and buffer circuit 107, and/or the SERDES circuitry 165) of FIG. 1, the semiconductor device of FIG. 2, the WCK input circuit 320 of FIG. 3, or combinations thereof. The WCK_T and WCK_N clock signals may correspond to the WCK_T and WCK_N clock signals of FIGS. 1-3. The N1N and N1T clock signals and the N2T and N2N clock signals may correspond to the N1N and N1T clock signals and the N2T and N2N clock signals, respectively, of FIGS. 2 and 3. The T and N clock signals may correspond to the T and N clock signals of FIGS. 1-3. The DP0-3 clock signals may correspond to the DP0-3 clock signals of FIG. 2. The PHASE 0-3 clock signals may correspond to the PHASE 0-3 clock signals of FIGS. 1 and 2. The logic high and logic low voltages of the WCK_T and WCK_N clock signals may be based on a specified voltages VIH and VIL, respectively, which have a voltage differential that is less than a voltage differential between the supply voltages VDD2 and VSS. The logic high and logic low of the N1N and N1T clock signals may be based on the supply voltages VDD2 and VSS, but the magnitudes of the logic high and logic low voltages (e.g., VH1 and VL1, respectively) of the N1N and N1T clock signals may have a voltage differential that is greater than the VII and VIL voltages and less than a voltage differential between the supply voltages VDD2 and VSS. The logic high and logic low voltages of the N2T and N2N clock signals may be based on the supply voltages VDD2 and VSS, respectively, but as explained above with respect to the de-emphasis operation, the magnitudes of the logic high and logic low voltages (e.g., V2H and V2L, respectively) of the N2T and N2N clock signals may have a voltage differential that is greater than the VH1 and VL1 voltages and less than a voltage differential between the supply voltages VDD2 and VSS.

At time T0, timing the WCK_T clock signal may transition to The VIH voltage and the WCK_N clock signal may transition to the VIL voltage. In response to transitions of the WCK_T and WCK_N clock signals, the N1N clock signal may transition to the VH1 voltage and the N1T clock signal may transition to the VL1 voltage (e.g., via the first stage 222 of FIG. 2 and/or the first stage 322 of FIG. 3). In response to transitions of the N1N and N1T clock signals, the N2T clock signal may transition to the VH2 voltage and the N2N clock signal may transition to the VL2 voltage (e.g., via the second stage 224 of FIG. 2 and/or the second stage 324 of FIG. 3). In response to transitions of the N2T and N2N clock signals, the T clock signal may transition to the internal voltage VIB and the N2N clock signal may transition to the supply voltage VSS (e.g., via the driver 226 and driver 228 of FIG. 2 and/or the driver 326 and driver 328 of FIG. 3).

At time T1, timing the WCK_T clock signal may transition to the VIL voltage and the WCK_N clock signal may transition to the VIH voltage. In response to transitions of the WCK_T and WCK_N clock signals, the N1N clock signal may transition to the VL1 voltage and the N1T clock signal may transition to the VH1 voltage (e.g., via the first stage 222 of FIG. 2 and/or the first stage 322 of FIG. 3). In response to transitions of the N1N and N1T clock signals, the N2T clock signal may transition to the VL2 voltage REF and the N2N clock signal may transition to the VH2 voltage (e.g., via the second stage 224 of FIG. 2 and/or the second stage 324 of FIG. 3). In response to transitions of the N2T and N2N clock signals, the T clock signal may transition to the supply voltage VSS and the N2N clock signal may transition to the internal voltage VIB (e.g., via the driver 226 and driver 228 of FIG. 2 and/or the driver 326 and driver 328 of FIG. 3).

Timing transitions for times T2-T5 may repeat as described with respect to times T0 and T1. The T and N clock signals may be used to generate the DP0-3 clock signals, such as via the divider circuit 232 of FIG. 2. As shown in the timing diagram 400, the DP0-3 clock signals are phase-shifted (e.g., 90 degrees) relative to one another, and have a different frequency than the WCK_T, WCK_N, N1N, N1T, N2T, N2N, N and T clock signals. The PHASE 0-3 clock signals may be driven on the DP0-3 clock signals, respectively, such as via the drivers 234(0)-(3) of FIG. 2. The DP0-3 clock signals may be driven based on the internal voltage VIB and the supply voltage VSS, and the PHASE 0-3 clock signals may be driven based on the supply voltages VDD2 and VSS. Thus, in response to transitions of the T and N clock signals, the DP0 clock signal may transition to the internal voltage VIB at time T0 and may transition to the supply voltage VSS at time T2, the DP1 clock signal may transition to the internal voltage VIB at time T1 and may transition to the supply voltage VSS at time T3, the DP2 clock signal may transition to the internal voltage VIB at time T2 and may transition to the supply voltage VSS at time T4, and the DP3 clock signal may transition to the internal voltage VIB at time T3 and may transition to the supply voltage VSS at time T5. The PHASE 0-3 clock signals may follow the above-described transitions of the DP0-3 clock signals, except to the supply voltage VDD2 instead of the internal voltage VIB.

The timing diagram 400 is exemplary for illustrating operation of various described embodiments. Although the timing diagram 400 depicts a particular arrangement of signal transitions of the included signals, one of skill in the art will appreciate that additional or different transitions may be included in different scenarios without departing from the scope of the disclosure, including addition of delays between serially-related signals. Further, the depiction of a magnitude of the signals represented in the timing diagram 400 is not intended to be to scale, and the representative timing is an illustrative example of a timing characteristics.

Although this disclosure has been described in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosure. Thus, it is intended that the scope of at least some of the present disclosure herein disclosed should not be limited by the particular disclosed embodiments described above.

What is claimed is:

1. An apparatus comprising:
    a clock input buffer configured to receive first complementary clock signals and is coupled to a first supply voltage and a second supply voltage, wherein, responsive to the first complementary clock signals, the clock input buffer is configured to drive second complementary clock signals based on the first supply voltage and the second supply voltage; and
    a divider circuit coupled to an internal voltage and the second supply voltage and configured to provide a divided clock signal based on the second complementary clock signals and the internal voltage and the second supply voltage, wherein the internal voltage is different than the first supply voltage.

2. The apparatus of claim 1, Wherein the divider circuit further comprises an output buffer coupled to the first supply voltage and the second supply voltage and configured to receive the divided clock signal, wherein, in response to the divided clock signal, the output buffer is configured to drive a second divided clock signal based on the first supply voltage and the second supply voltage.

3. The apparatus of TT wherein the clock input buffer comprises:
    a differential amplifier circuit configured to receive the first complementary clock signals and to provide intermediate complementary clock signals; and
    a cross-coupled buffer configured to provide the second complementary clock signals based on the intermediate clock signals.

4. The apparatus of claim 1, wherein the clock input buffer further comprises a pair of driver circuits coupled to the internal voltage and the second supply voltage and configured to receive the second complementary clock signals, wherein, in response to the second complementary clock signals, the pair of driver circuits are configured to provide third complementary clock signals to the divider circuit based on the internal voltage and the second supply voltage, wherein the divider circuit is configured to provide the divided clock signal in response to the third complementary clock signals.

5. The apparatus of claim 3, wherein the differential amplifier circuit comprises:
    a first differential amplifier configured to provide a first clock signal of the intermediate complementary clock signals based on receipt of a first clock signal of the first complementary clock signals at a first input and a second clock signal of the first complementary clock signals at a second input; and
    a second differential amplifier configured to provide a second clock signal of the intermediate complementary clock signals based on receipt of the second clock signal of the first complementary clock signals at a first input and the first clock signal of the first complementary clock signals at a second input.

6. The apparatus of claim 5, wherein the cross-coupled buffer comprises:
    a first inverter coupled to the first supply voltage and the second supply voltage and configured to provide a first clock signal of the second complementary clock signals at a first output node based on receipt of the first clock signal of the intermediate complementary clock signals; and
    a second inverter coupled to the first supply voltage and the second supply voltage and configured to provide a second clock signal of the second complementary clock signals at a second output node based on receipt of the second clock signal of the intermediate complementary clock signals.

7. The apparatus of claim 5, wherein the cross-coupled buffer further comprises:
    a first transistor coupled to the first supply voltage and configured to provide the first supply voltage to the second output node of the second inverter based on the value of the first output node of the first inverter; and
    a second transistor coupled to the first supply voltage and configured to provide the first supply voltage to the first output node of the first inverter based on the value of the second output node of the second inverter.

8. The apparatus of claim 7, wherein the first transistor and the second transistor are p-type transistors.

9. The apparatus of claim 1, wherein, based on the second complementary clock signals and the internal voltage, the divider circuit is configured to provide a plurality of divided clock signals including the divided clock signal.

10. The apparatus of claim 9, wherein the divider circuit is configured to shift a phase of the plurality of divided clock signals relative to one another.

11. The apparatus of claim 9, wherein the divider circuit is configured to provide the plurality of divided clock signals having a frequency that is different than a frequency of the second complementary clock signals.

12. The apparatus of claim 11, wherein the frequency of the plurality of divided clock signals is half of a frequency of the second complementary clock signals.

13. A method comprising:
    receiving, at a clock input buffer, first complementary clock signals;
    responsive to the first complementary clock signals, providing second complementary clock signals based on a first voltage and a second voltage; and
    providing, via a divider circuit, a divided clock signal based on the second complementary clock signals and a third voltage and the second voltage, wherein a magnitude of the first voltage is different than a magnitude of the third voltage.

14. The method of claim 13, further comprising driving, at the clock input buffer, third complementary clock signals responsive to the second complementary clock signals and based on the third voltage and the second voltage, wherein the divided clock signal is provided responsive to the third complementary dock signals.

15. The method of claim 13, wherein the second complementary clock signals comprise a first clock signal and a second clock signal, the method further comprising cross-coupling first and second clock signals of the second complementary clock signals.

16. The method of claim 13, further comprising driving a second divided clock signal responsive to the divided clock signal and based on the first voltage and the second voltage.

* * * * *